United States Patent [19]
Washida et al.

[11] Patent Number: 5,889,327
[45] Date of Patent: Mar. 30, 1999

[54] SEMICONDUCTOR DEVICE WITH A PACKAGE HAVING A PLURALITY OF BUMP ELECTRODES AND MODULE WITH A PLURALITY OF SEMICONDUCTOR DEVICES

[75] Inventors: Tetsuro Washida; Katsunori Ochi, both of Tokyo, Japan

[73] Assignee: Mitsubishi Denki Kabushiki Kaisha, Tokyo, Japan

[21] Appl. No.: 816,779

[22] Filed: Mar. 19, 1997

[30] Foreign Application Priority Data

Oct. 4, 1996 [JP] Japan .................................. 8-264352

[51] Int. Cl.⁶ ........................ H01L 23/48; H01L 25/52; H01L 29/40
[52] U.S. Cl. .................... 257/737; 257/778; 257/738; 257/678; 438/613
[58] Field of Search ..................... 257/697, 737, 257/738, 777, 778, 678; 228/180, 22; 438/613

[56] References Cited

U.S. PATENT DOCUMENTS

| | | | |
|---|---|---|---|
| 3,984,860 | 10/1976 | Logue | 257/48 |
| 4,860,087 | 8/1989 | Matsubara et al. | 257/776 |
| 5,082,802 | 1/1992 | Gelsomini | 257/666 |
| 5,258,648 | 11/1993 | Lin | 257/747 |
| 5,399,898 | 3/1995 | Rostoker | 257/778 |
| 5,426,263 | 6/1995 | Potter et al. | 257/698 |
| 5,477,933 | 12/1995 | Nguyen | 174/262 |
| 5,705,858 | 1/1998 | Tsukamoto | 257/778 |
| 5,717,229 | 2/1998 | Zhu | 257/777 |

FOREIGN PATENT DOCUMENTS

| | | |
|---|---|---|
| 60-28255 | 2/1985 | Japan . |
| 64-77135 | 3/1989 | Japan . |
| 4 80933 | 3/1992 | Japan . |
| 4186871 | 7/1992 | Japan . |

*Primary Examiner*—Mahshid Saadat
*Assistant Examiner*—Jhihan B. Clark

[57] ABSTRACT

A semiconductor device is formed of stacked first and second semiconductor substrates each having internal circuits which are packaged within a package having a plurality of bump electrodes on the top and bottom principal planes. The bump electrodes on the top principal plane of the package are electrically connected to the internal circuits of the first semiconductor substrate and the bump electrodes on the bottom plane of the semiconductor substrate are electrically connected to the internal circuit of the second semiconductor substrate with the first and second semiconductor substrates arranged in mirror symmetry both physically with respect to each other and with respect to signals to be input into or output from the internal circuits. Module structures using a plurality of the semiconductor devices mentioned above are also described.

10 Claims, 12 Drawing Sheets

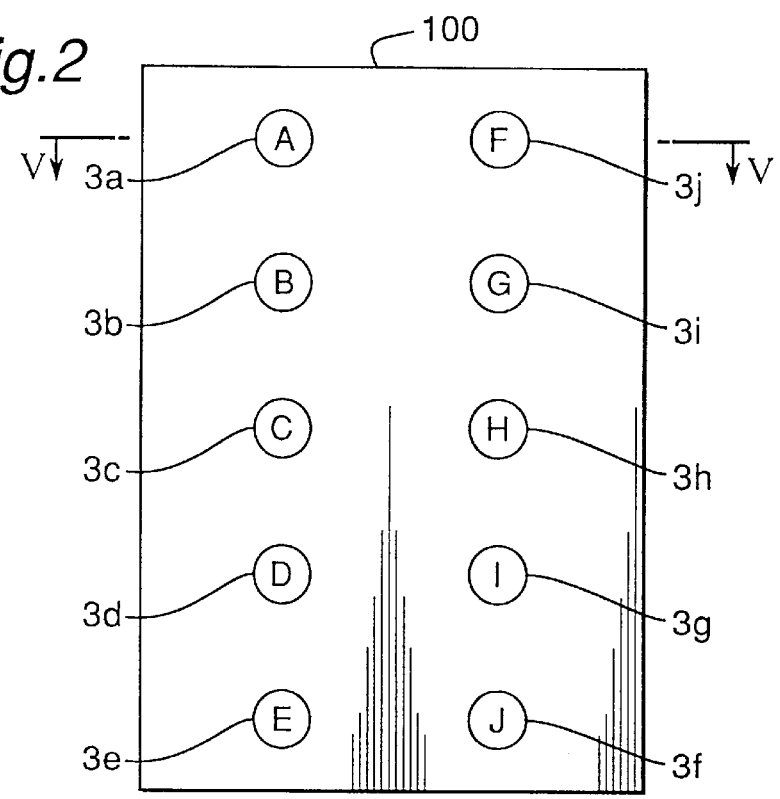
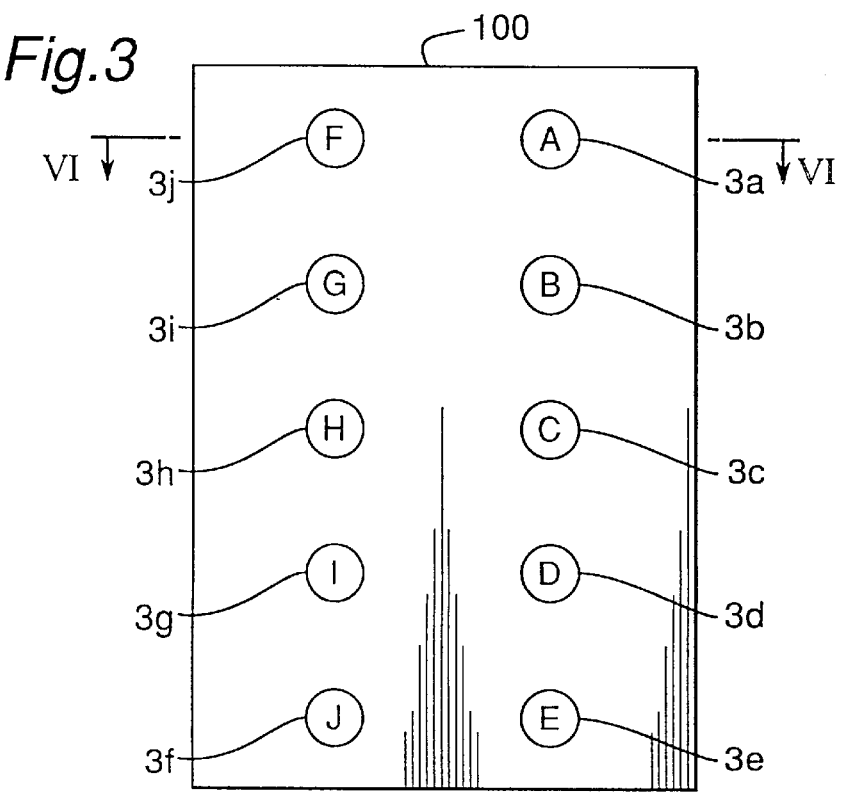

SEMICONDUCTOR DEVICE WITH A PACKAGE HAVING A PLURALITY OF BUMP ELECTRODES AND MODULE WITH A PLURALITY OF SEMICONDUCTOR DEVICES

BACKGROUND OF THE INVENTION

1. Field of the Invention

The present invention relates to a semiconductor device and a module of semiconductor devices, more particularly to a semiconductor device with bump electrodes and a module densely packed with such semiconductor devices.

2. Description of the Prior Art

FIG. 20 is a partial cross section of a conventional semiconductor device with bump electrodes as disclosed in the Japanese Patent Laid-open Publication HEI 5-82582. With reference to FIG. 20, 1001 denotes a semiconductor substrate; 1002, bonding pads formed on the semiconductor substrate 1001; 1003, bump electrodes formed on the bonding pads 1002; and 1004, a molding resin forming a package.

The conventional bump electrodes of the aforementioned semiconductor device for connecting it with external devices are formed right on top of the bonding pads 1002 arranged on the semiconductor substrate 1001. According to the invention HEI 5-82582 the external dimension of the semiconductor device is reduced almost to the size of the semiconductor substrate 1001 to increase the packaging density. However, it fails to teach or indicate any method to further increase the packaging density.

SUMMARY OF THE INVENTION

Accordingly, an essential object of the present invention is to provide a semiconductor device with bump electrodes which allow for an increase in the packaging density of the semiconductor device and a module of such semiconductor devices which has an improved packaging density.

The semiconductor device according to the present invention comprises a package with a top surface, a bottom surface, and bump electrodes projecting from the top and bottom surfaces.

The number of the bump electrodes projecting from the top surface is greater than one and the bump electrodes projecting from the bottom surface are arranged to form a mirror symmetry with the bump electrodes projecting from the top surface.

A module of the present invention comprises: (a) a package with a top surface and a bottom surface; (b) a first semiconductor device including a plurality of first bump electrodes on one surface thereof and a plurality of second bump electrodes on the other surface arranged to form a mirror symmetry with the first bump electrodes, the first bump electrodes projecting from the top surface of the package; (c) a second semiconductor device including a plurality of first bump electrodes on one surface thereof and a plurality of second bump electrodes on the other surface arranged to form a mirror symmetry with the first bump electrodes, the second bump electrodes projecting from the bottom surface of the package; (d) a first mounting plate connected to the first bump electrodes of the first semiconductor device; (e) a second mounting plate, including through holes between the two major surfaces thereof, with the second bump electrodes of the first semiconductor device connected to one of the major surfaces of the second mounting plate and with the first bump electrodes of the second semiconductor device connected to the other surface of the second mounting plate, the through holes connecting pairs of the second bump electrodes of the first semiconductor device and the first bump electrodes of the second semiconductor device which are designed to receive the same signals; and (f) a third mounting plate connected to the second bump electrodes of the second semiconductor device.

A semiconductor device of the present invention may comprise: (a) a package with a first major surface and a second major surface; (b) bump electrodes projecting from the first and second major surfaces; (c) a first semiconductor device with two major surfaces placed inside the package and including internal circuits in one of the major surfaces, the internal circuits being connected to the bump electrodes projecting from the first major surface of the package; and (d) a second semiconductor device with two major surfaces placed inside the package and including internal circuits in one of the major surfaces, the internal circuits being connected to the bump electrodes projecting from the second major surface of the package, the other major surface of the second semiconductor device bonded to the other major surface of the first semiconductor device.

Another module of the present invention may comprise: (a) a semiconductor device with a top surface and a bottom surface including bump electrodes projecting from the top and bottom surfaces; (b) a first mounting plate connected to the bump electrodes projecting from the top surface; and (c) a second mounting plate connected to the bump electrodes projecting from the bottom surface.

The above module of the present invention may further include an IC card, wherein the first mounting plate forms a panel of the IC card.

Another module of the present invention may comprise: a mounting plate including a recess on one of the major surfaces thereof which has a first side surface and a second side surface opposing each other; and a semiconductor device including first electrodes being connected to the first side surface and second electrodes being connected to the second side surface.

The package of the above semiconductor device of the present invention may also include side surfaces in contact with the first and second major surfaces. Further the semiconductor device may comprise: bump electrodes projecting from the side surfaces; and a third semiconductor device, placed inside the package, including internal circuits in one of the major surfaces thereof, the internal circuits being connected to the bump electrodes projecting from the side surfaces of the package.

Another semiconductor device of the present invention may comprise: a package with a major surface having protrusions for being inserted into recesses formed on a mounting plate; and bump electrodes projecting from the major surface of the package.

Another module of the present invention may comprise: (a) a mounting plate with a major surface having recesses thereon; and (b) a semiconductor device comprising: a package with a major surface including protrusions thereon, the package being mounted on the mounting plate by inserting the protrusions into the recesses of the mounting plate; and bump electrodes projecting from the major surface of the package and connected to the major surface of the mounting plate.

BRIEF DESCRIPTION OF THE DRAWINGS

The present invention will become more fully understood from the detailed description given below and the accompanying diagrams wherein:

FIG. 2 is a top view of the semiconductor device of Embodiment 1 of the present invention with an even number of bump electrodes;

FIG. 3 is a bottom view of the semiconductor device of Embodiment 1 of the present invention with an even number of bump electrodes;

DESCRIPTION OF PREFERRED EMBODIMENTS

The preferred embodiments of the present invention are described below with reference to the accompanying figures.
Embodiment 1

Figure 1:
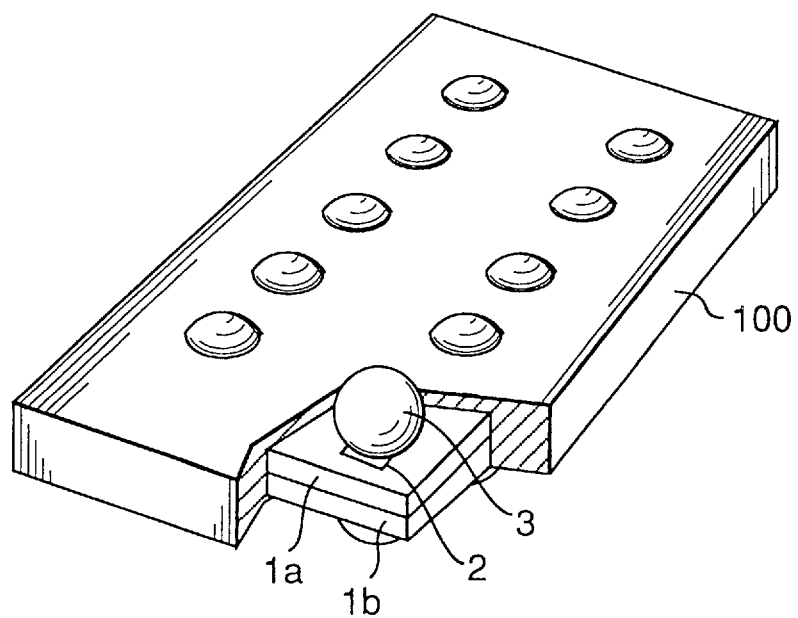
FIG. 1 is a perspective partial cross sectional view of the semiconductor device of Embodiment 1 of the present invention with an even number of bump electrodes.

The semiconductor device of Embodiment 1 is described as follows. FIG. 1 is a perspective partial cross sectional view of the semiconductor device of the present invention with an even number of bump electrodes. With reference to FIG. 1, the semiconductor device comprises a pair of first and second semiconductor substrates 1a and 1b stacked with each other and packaged with a molding resin so that part of each bump electrode 3 is exposed from upper and lower surfaces of the molding package 100. Each of the first and second semiconductor substrates has a plurality of bonding pads 2 arranged on one principal plane which is not stacked with each other. These bonding pads 2 electrically connect between respective bump electrodes 3 and corresponding electrodes (not shown) provided on each of the principal planes of the first and second substrates 1a and 1b.

The arrangement pattern of bonding pads 2, and, accordingly, that of bump electrodes 3 is same between the first and second substrates 1a and 1b, as shown in FIGS. 2 and 3. However, circuits arranged on the second semiconductor substrate 1b are designed so that signals to be input into or output from the same through corresponding bump electrodes are in mirror symmetry with those of the first semiconductor substrate 1a. This will be explained in more detail below.

FIG. 2 is a top view of the semiconductor device shown in FIG. 1. With reference to FIG. 2, bump electrodes on the top of the package 100 are arranged so that they correspond to the input/output terminals of the internal circuits of the semiconductor substrate 1a. The signals on those bump electrodes 3a–3j of the top surface of the package 100 are denoted as A–J. FIG. 3 is a bottom view of the semiconductor device shown in FIG. 1. As apparent from comparison of FIG. 3 with FIG. 2, signals A–J of the second semiconductor substrate 1b, which are same as those of the first semiconductor substrate 1a, are output from or input into the second semiconductor substrate 1b through bump electrodes 3a–3j which are arranged in mirror symmetry with those 3a–3j on the side of the first semiconductor substrate 1a. This ensures that, even when the semiconductor device is reversed in up and down direction, the same signals are obtained at respective bump electrodes locating positions as before reversion.

Figure 4:
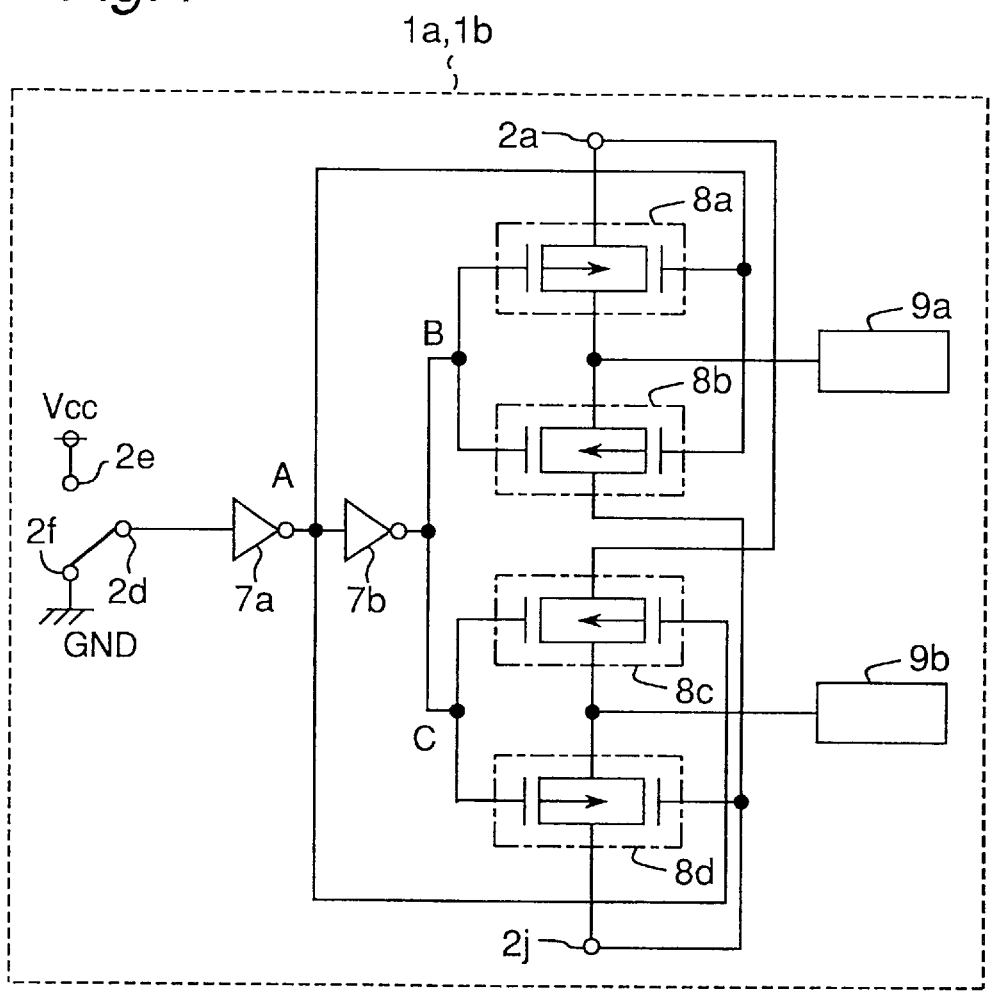
FIG. 4 shows partial circuits of the semiconductor substrates of the semiconductor device of Embodiment 1 of the present invention with an even number of bump electrodes.

FIG. 4 shows partial circuits of the semiconductor substrates 1a and 1b. With reference to FIG. 4, each of the semiconductor substrates 1a and 1b includes internal circuits 9a and 9b, transfer gates 8a and 8b for receiving signals from the internal circuits 9a, and transfer gates 8c and 8d for receiving signals from the internal circuits 9b. The outputs from the transfer gates 8a and 8c are transferred to a bonding pad, for example, 2a; and the outputs from the transfer gates 8b and 8d are transferred to a bonding pad, for example 2j. One of the two gates of the transfer gate 8a and the corresponding gate of the transfer gate 8b are both connected to a node B. Likewise, one of the two gates of the transfer gate 8c and the corresponding gate of the transfer gate 8d are both connected to a node C. The nodes B and C receive input signals through an inverter circuit 7b. The other gates of the respective transfer gates 8a, 8b, 8c, and 8d are combined together and connected to a node A, which receives input signals through an inverter circuit 7a. The inverter circuit 7a is connected to the inverter circuit 7b on one end and to a bonding pad 2d on the other. This circuit also includes a power supply pad 2e for receiving a power supply voltage Vcc and a ground pad 2f for connected the circuit to the ground voltage GND. The pad 2d is connected to either the pad 2e or 2f through a conductive layer formed in the assembly process.

The operation of the circuit will be described next. In a case in which the bonding pad 2d of the semiconductor substrate 1a is connected to the ground pad 2f through a conductive layer formed in the assembly process, the low level voltage is applied to the nodes B and C through the inverter circuits 7a and 7b. Then one of the gates (the left gate in FIG. 4) of each of the transfer gates 8a, 8b, 8c, and 8d receives the low level voltage. On the other hand, the other gate (the right gate in FIG. 4) of each of the transfer gates 8a, 8b, 8c, and 8d becomes high through the node A. Therefore, the transfer gates 8a and 8d are on and the transfer gates 8b and 8c are off. Accordingly, the output signal from the internal circuit 9a is output to the bonding pad 2a through the transfer gate 8a, and the output signal from the internal circuit 9b is output to the bonding pad 2j through the transfer gate 8d.

In a case in which the bonding pad 2d of the semiconductor substrate 1b is connected to the power supply pad 2e of the voltage Vcc through a conductive layer formed in the assembly process, the high level voltage is applied to the nodes B and C through the inverter circuits 7a and 7b. Then one of the two gates (the left gate in FIG. 4) of each of the transfer gates 8a, 8b, 8c, and 8d receives the high level voltage. On the other hand, the other gate (the right gate in FIG. 4) of each of the transfer gates 8a, 8b, 8c, and 8d becomes low through the node A. Therefore, the transfer gates 8a and 8d are off, and the transfer gates 8b and 8c are on. Accordingly, the output signal from the internal circuit 9a is output to the bonding pad 2j through the transfer gate 8b, and the output signal from the internal circuit 9b is output to the bonding pad 2a through the transfer gate 8c. Thus the reversed signals to the normal signals can be obtained at the bonding pads.

Figure 5:
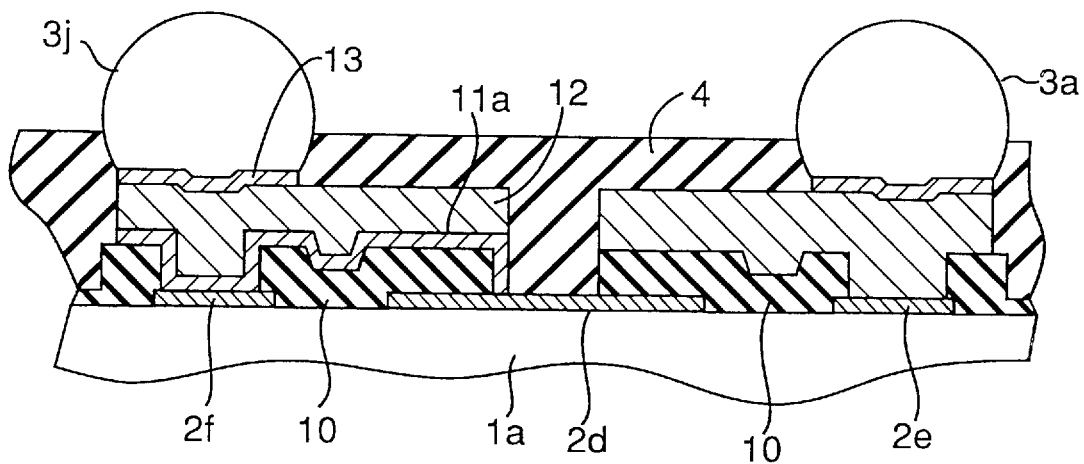
FIG. 5 is a partial cross section of the semiconductor device shown in FIG. 2 along the line A—A, the semiconductor device having an even number of bump electrodes.

FIG. 5 is a partial cross-sectional view of the semiconductor device along the line V—V of FIG. 2. This diagram shows the bonding pad 2d and the ground pad 2f connected to each other as shown in FIG. 4. This connection is made during the assembly process. With reference to FIG. 5, insulating layers 10 are formed between the bonding pad 2d and the ground pad 2f on the semiconductor substrate 1a and between the bonding pad 2d and the power supply pad 2e. A conductive layer 11a is formed on the insulating layer 10 between the bonding pad 2d and the ground pad 2f to connect the two pads. Then another conductive layer 12 is formed on the conductive layer 11a and also on the insulating layer 10 between the bonding pad 2d and the power supply pad 2e. Another conductive layer 13 is formed on each of the conductive layers 12, and the bump electrodes 3a and 3j are made on the conductive layers 13. Finally the semiconductor device is molded with resin 4.

Thus the bonding pad 2d and the ground pad 2f are connected by the conductive layer 11a.

Figure 6:
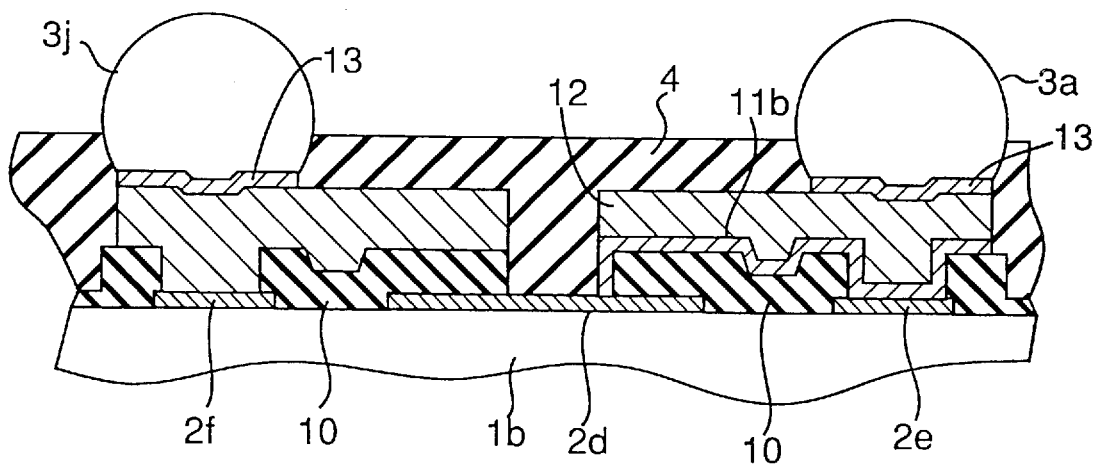
FIG. 6 is a partial cross section of the semiconductor device shown in FIG. 3 along the line B—B, the semiconductor device having an even number of bump electrodes.

FIG. 6 is a partial cross-sectional view of the semiconductor device along the line VI—VI of FIG. 3. This diagram shows the bonding pad 2d and the power supply pad 2e of FIG. 4 connected to each other. This connection is made during the assembly process. With reference to FIG. 6, insulating layers 10 are formed between the bonding pad 2d and the ground pad 2f on the semiconductor substrate 1b and between the bonding pad 2d and the power supply pad 2e. A conductive layer 11b is formed on the insulating layer 10 between the bonding pad 2d and the power supply pad 2e to connect the two pads. Then another conductive layer 12 is formed on the conductive layer 11b and also on the insulating layer 10 between the bonding pad 2d and the ground pad 2f. Another conductive layer 13 is formed on each of the conductive layers 12, and the bump electrodes 3a and 3j are formed on the conductive layers 13. Finally the semiconductor device is molded with resin 4. Thus, the bonding pad 2d and the power supply pad 2e are connected by the conductive layer 11b.

Figure 7:
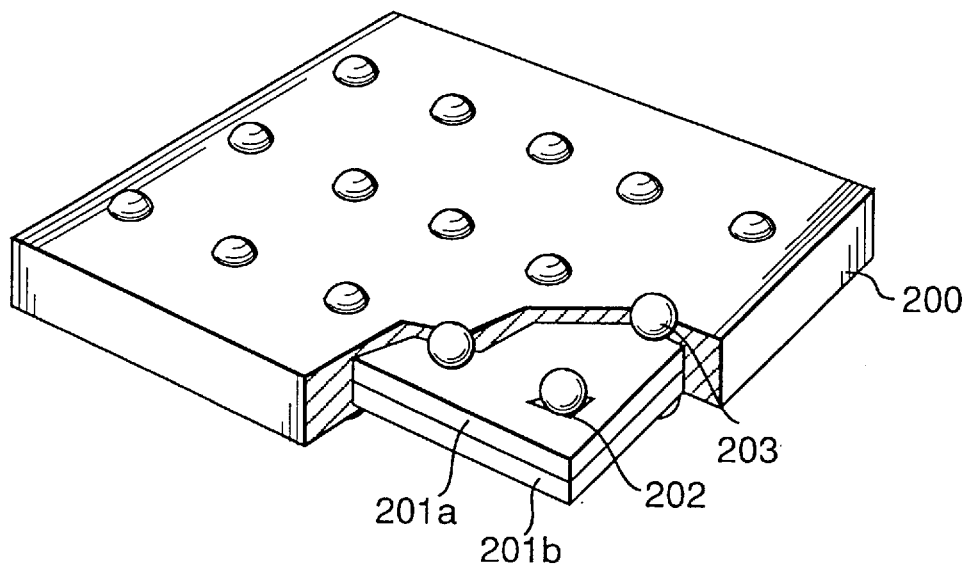
FIG. 7 is a perspective partial cross sectional view of the semiconductor device of Embodiment 1 of the present invention with an odd number of bump electrodes.

FIG. 7 is a partially cut off perspective view of the semiconductor device of the present invention with an odd number of bump electrodes on each of top and bottom surfaces thereof. With reference to FIG. 7, the semiconductor device comprises a pair of semiconductor substrates 201a and 201b stacked with each other and resin package 200 mold-packaging the stacked substrates therewithin. Similarly to the semiconductor device shown in FIG. 1, the semiconductor substrates 1a and 1b are in mirror symmetry with each other in relation to signals to be output or input.

A plurality of bonding pads 202 are formed on each of the semiconductor substrates 201a and 201b and bump electrodes 203 are each formed on top of the bonding pads 202 so that part of each bump electrode is exposed from each of top and bottom surfaces of the package. Some of the bump electrodes 203 may be dummy electrodes.

Figure 8:
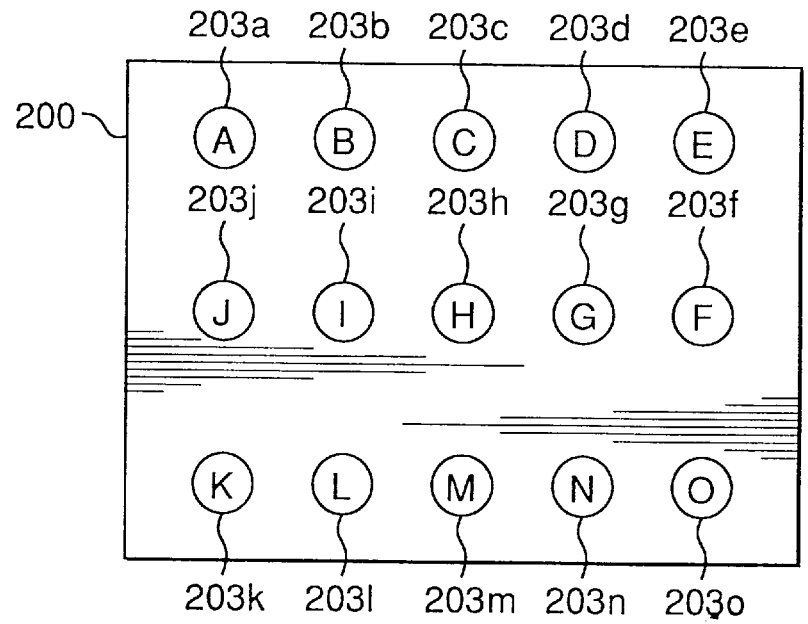
FIG. 8 is a top view of the semiconductor device of Embodiment 1 of the present invention with an odd number of bump electrodes.
Figure 9:
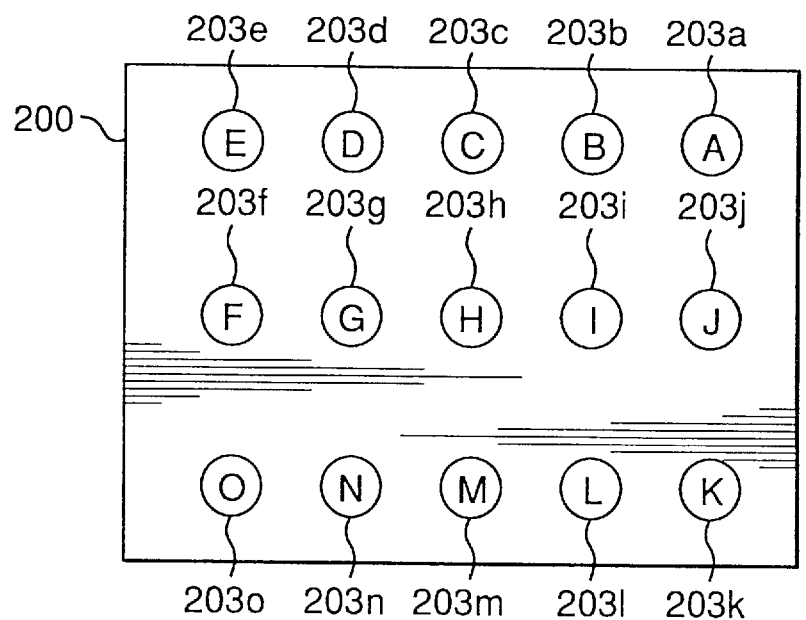
FIG. 9 is a bottom view of the semiconductor device of Embodiment 1 of the present invention with an odd number of bump electrodes.

FIG. 8 is a top view of the package 200 shown in FIG. 7. With reference to FIG. 8, bump electrodes 203a–203p on the top of the package 200 are arranged so that they correspond to the input/output terminals of the internal circuits of the semiconductor substrate 1a. The signals on those bump electrodes on the top surface of the package 200 are denoted as A–O. FIG. 9 is a bottom view of the semiconductor device shown in FIG. 7. As shown in FIG. 9, signals A–O to be output from or input into the semiconductor substrate 1b are in mirror symmetry with those of the semiconductor substrate 1a.

Figure 10:
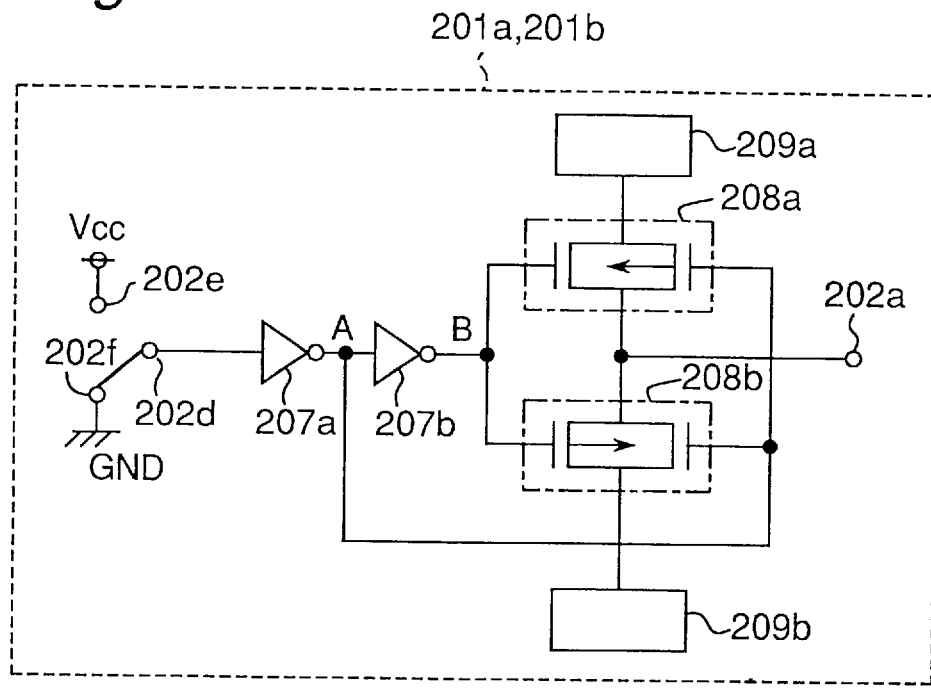
FIG. 10 shows partial circuits of the semiconductor substrates of the semiconductor device of Embodiment 1 of the present invention with an odd number of bump electrodes.

FIG. 10 shows partial circuits of the semiconductor substrates 201a and 201b. With reference to FIG. 10, each of the semiconductor substrates 201a and 201b includes internal circuits 209a and 209b, transfer gates 208a and 208b for receiving signals from the internal circuits 209a and 209b respectively. The output from the internal circuits 209a or 209b is transferred to a bonding pad, for example 202a. One of the two gates of the transfer gate 208a and the corresponding gate of the transfer gate 208b are both connected to a node B which receives input signals through an inverter circuit 207b. The other gates of the respective transfer gates 208a and 208b are connected to a node A which receives input signals through an inverter circuit 207a. The inverter circuit 207a is connected to the inverter circuit 207b on one end and to a bonding pad 202d on the other. This circuit also includes a power supply pad 202e for receiving a power supply voltage Vcc and a ground pad 202f being connected to the ground voltage GND. The pad 202d is connected to either the pad 202e or 202f through a conductive layer formed in the assembly process.

The operation of the circuit will be described next. In a case in which the bonding pad 202d of the semiconductor substrate 201a is connected to the ground pad 202f through a conductive layer formed in the assembly process, the low level voltage is applied to the node B through the inverter circuits 207a and 207b. Then one of the two gates (the left gate in FIG. 10) of each of the transfer gates 208a and 208b receives the low level voltage. On the other hand, the other gate (the right gate in FIG. 10) of each of the transfer gates 208a and 208b becomes high through the node A. Therefore the transfer gates 208b are on. Accordingly the output signal from the internal circuit 209b is output to the bonding pad 202a through the transfer gate 208b.

In a case in which the bonding pad 202d of the semiconductor substrate 201b is connected to the power supply pad 202e of a voltage Vcc through a conductive layer formed in the assembly process, the high level voltage is applied to the node B through the inverter circuits 207a and 207b. Then one of the two gates (the left gate in FIG. 10) of each of the transfer gates 208a and 208b receives the high level voltage. On the other hand, the other gate (the right gate in FIG. 10) of each of the transfer gates 208a and 208b becomes low through the node A. Therefore, the transfer gate 208a is on and the transfer gate 208b is off. Accordingly, the output signal from the internal circuit 209a is output to the bonding pad 202a through the transfer gate 208a. Thus, the reversed signals to the normal signals can be obtained at the bonding pads. The implementation of the connections of the bonding pad to the ground pad or to the power supply pad is the same as shown in FIGS. 5 and 6.

The present embodiment will provide a more compact, thinner, stiffer, and denser semiconductor device than a conventional one which is a combination of two separate semiconductor devices adhering on top of another, one corresponding to normal signals and the other corresponding to reversed signals.

Embodiment 2

Figure 11:
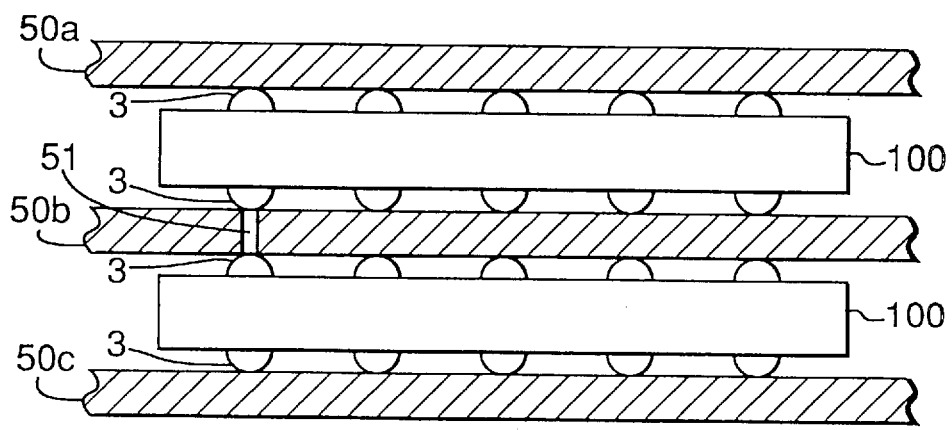
FIG. 11 shows a partial cross sectional view of the module of Embodiment 2 of the present invention.

FIG. 11 shows the module of Embodiment 2 of the present invention. With reference to FIG. 11, an even number of bump electrodes 3, which are arranged on the top surface of the package 100 to correspond to the normal signals from the internal circuits of the semiconductor substrate, are fixed on the bottom surface of a mounting plate 50a. An even number of bump electrodes 3, which are arranged on the bottom surface of the package 100 to form a mirror symmetry to the normal signals from the internal circuits of the semiconductor substrate, are fixed on the top surface of another mounting plate 50b. Another similar semiconductor device is mounted on the bottom surface of the mounting plate 50b. That is, an even number of bump electrodes 3, which are arranged on the top surface of the package 100 to correspond to the normal signals from the internal circuits of the semiconductor substrate, are fixed on the bottom surface of the mounting plate 50b. An even number of bump electrodes 3, which are arranged on the bottom surface of this package 100 to form a mirror symmetry to the normal signals from the internal circuits of the semiconductor substrate, are fixed on the top surface of still another mounting plate 50c. The mounting plate 50b has through holes 51 through which the even number of bump electrodes 3 on the bottom surface of the upper package 100, which are arranged to form a mirror symmetry to the normal signals from the internal circuits of the semiconductor substrate, are connected to the even number of bump electrodes 3 on the top surface of the other package 100, which are arranged to correspond to the normal signals from the internal circuits of the semiconductor substrate. While the packages 100 are used in the above description of the present embodiment, the packages 200 can be equally used in this embodiment.

Embodiment 2 provides a module which includes multiple stacked layers of semiconductor devices. Since the mounting plates have through holes through which the semiconductor devices are electrically connected, the area needed for wiring is saved. Thus the present embodiment improves the packaging density. It also provides a module less susceptible to noise.

Embodiment 3

Figure 12:
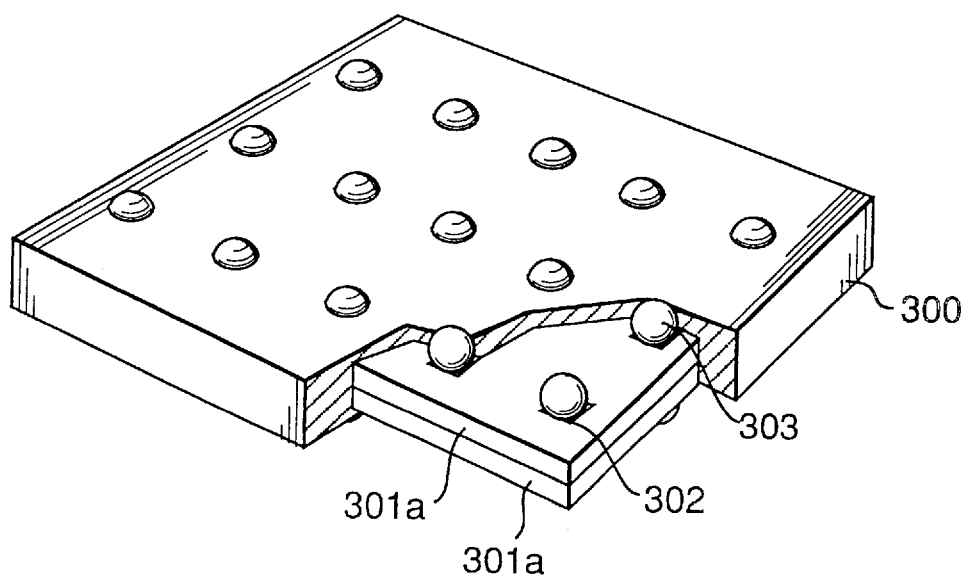
FIG. 12 is a perspective partial cross sectional view of the semiconductor device of Embodiment 3 of the present invention.

FIG. 12 is a perspective partial cross sectional view of the semiconductor device of Embodiment 3 of the present invention. With reference to FIG. 12, this semiconductor device comprises a package 300 which has identical top and bottom surfaces, one or more bump electrodes 303, and semiconductor substrates 301a which each have different front and back surfaces. The front surface of each semiconductor substrate 301a includes one or more bonding pads 302, which are connected to the internal circuits fabricated in the semiconductor substrate 301a. The aforementioned bump electrodes 303 are each formed on the bonding pads 302. The semiconductor substrates 301a are adhered to each other on their back surfaces with silver epoxy for example. The adhered semiconductor substrates with one or more bump electrodes 303 on each surface are molded with a resin so that part of each bump electrode 303 is exposed. Some of the bump electrodes 303 may be dummies.

This embodiment does not require semiconductor substrates which have a mirror symmetry to each other as Embodiment 1 does and can be built with the same type of semiconductor substrates. Since the package 300 has an identical arrangement of bump electrodes 303 on its top and bottom surfaces, this device can be formed into a module with the top surface facing either upward or downward. The other advantages of this device are the same as those of Embodiment 1.

Embodiment 4

Figure 13:
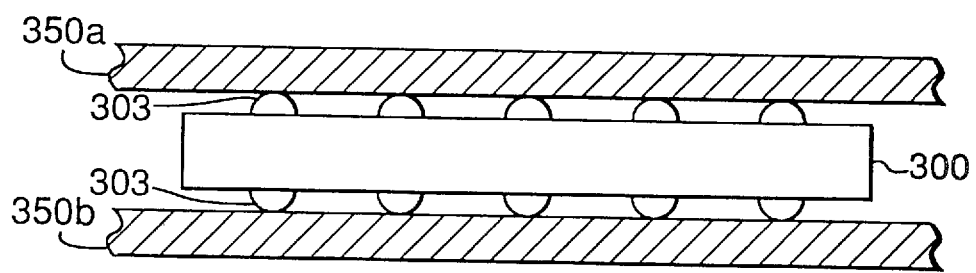
FIG. 13 shows a partial cross sectional view of the module of Embodiment 4 of the present invention.

FIG. 13 shows a module according to Embodiment 4 of the present invention. With reference to FIG. 13, one or more bump electrodes 303 projecting from the top surface of the package 300 are fixed to the bottom surface of a mounting plate 350a. The bump electrodes 303 are arranged so that they correspond to the normal signals from the internal circuits fabricated in one of the semiconductor substrates. One or more bump electrodes 303 projecting from the bottom surface of the package 300 are fixed to the top surface of a mounting plate 350b. Those bump electrodes 303 are arranged so that they correspond to the normal signals from the internal circuits fabricated in the other semiconductor substrate. The module of Embodiment 4 can be thin and can improve the stiffness.

Embodiment 5

Figure 14:
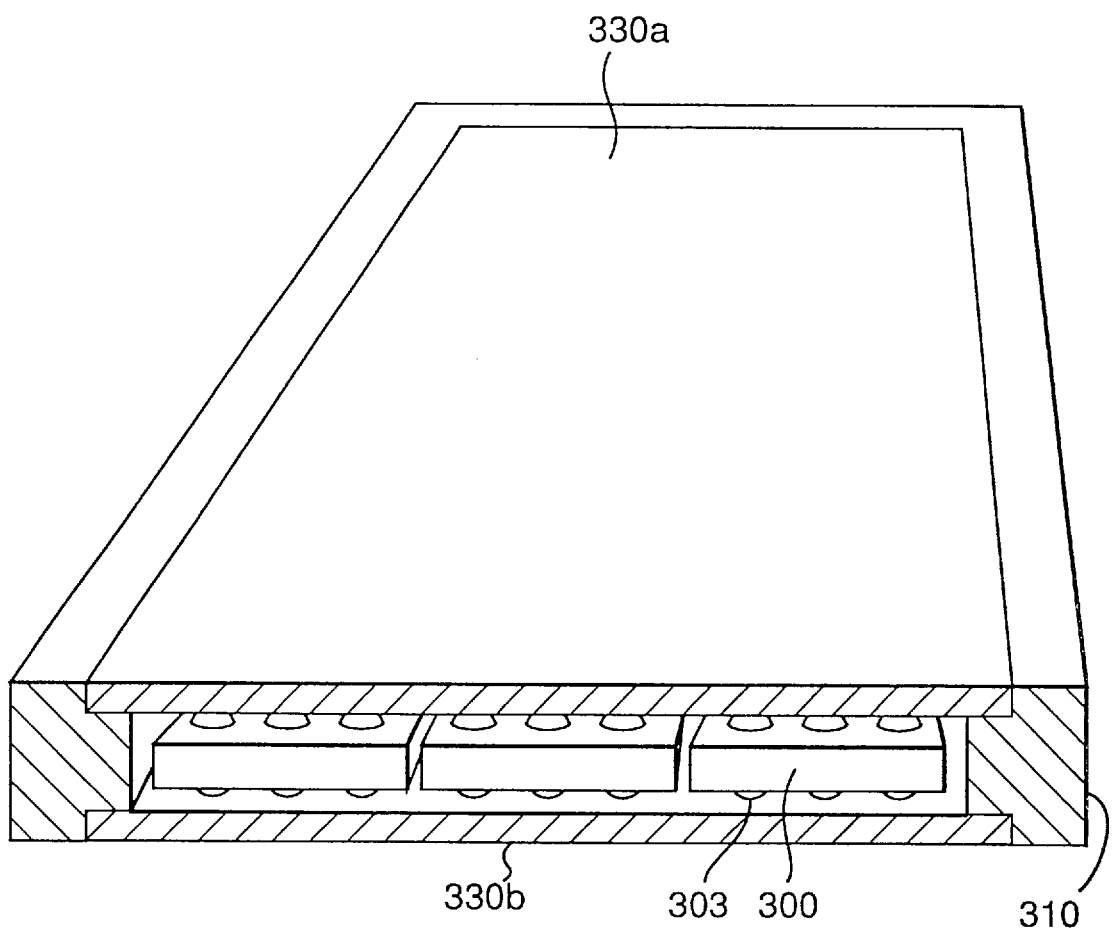
FIG. 14 shows a partial cross sectional view of the IC card of Embodiment 5 of the present invention.

FIG. 14 shows a partial cross section of a module according to Embodiment 5 implemented as an IC card. With reference to FIG. 14, one or more bump electrodes 303 projecting from the top surface of the package 300 are fixed to the bottom surface of a mounting plate 330a which has wiring thereon. The bump electrodes 303 are arranged so that they correspond to the normal signals from the internal circuits fabricated in one of the semiconductor substrates. One or more bump electrodes 303 projecting from the bottom surface of the package 300 are fixed to the top surface of a mounting plate 330b which has wiring thereon. Those bump electrodes 303 are arranged so that they correspond to the normal signals from the internal circuits fabricated in the other semiconductor substrate. The structure thus built is fitted into a frame 310 to form an IC card. The module of Embodiment 5 efficiently utilizes a limited space and hence can be built thinner thus resulting in an improved packaging density.

Embodiment 6

Figure 15:
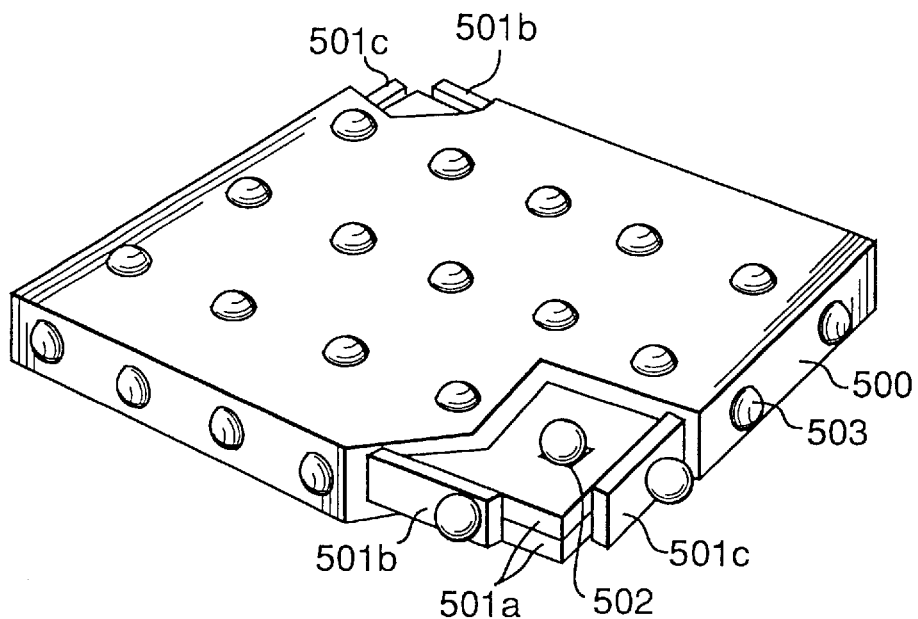
FIG. 15 is a perspective partial cross sectional view of the semiconductor device of Embodiment 6 of the present invention.

FIG. 15 is a perspective partial cross sectional view of the semiconductor device of Embodiment 6 of the present invention. This is the device of Embodiment 3 further comprising bump electrodes on the side surfaces of the package. With reference to FIG. 15, this semiconductor device comprises a package 500 having top, bottom, and side surfaces; one or more bump electrodes 503 projecting from each surface of the package 500; semiconductor substrates 501a each having front and back surfaces; semiconductor substrates 501b placed on the opposite side surfaces of the semiconductor substrates 501a; and semiconductor substrates 501c placed on the other opposite side surfaces of the semiconductor substrates 501a. One or more bonding pads 502 are formed on the surface of each of the semiconductor substrates 501a, 501b, and 501c. The bonding pads 502 are connected to the internal circuits fabricated in the semiconductor substrates 501a, 501b, and 501c. One or more bump electrodes 503 are formed on the bonding pads 502. The back surfaces of the semiconductor substrates 501*a* are adhered together with silver epoxy for example. Likewise, the semiconductor substrates 501*b* and 501*c* are adhered to the side surfaces of the semiconductor substrates 501*a* as shown in FIG. 15.

An advantage of Embodiment 6 in addition to those of Embodiment 3 is that one can use all the surfaces of the package for mounting.

Embodiment 7

Figure 16:
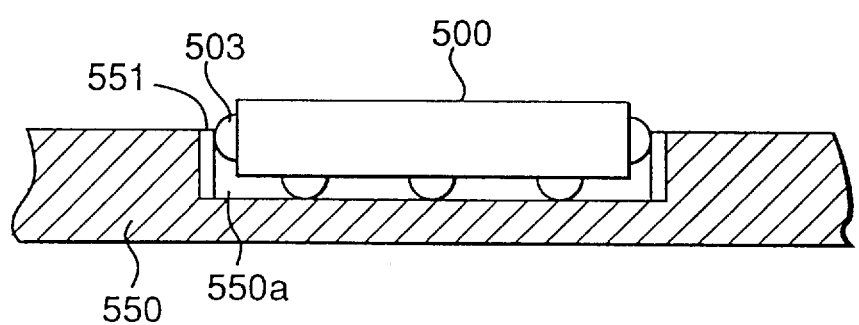
FIG. 16 shows a partial cross sectional view of the module of Embodiment 7 of the present invention.

FIG. 16 shows a partial cross sectional view of the module of Embodiment 7 of the present invention. With reference to FIG. 16, the mounting plate includes a recess 550*a* on its top surface. The opposing side surfaces of the recess 550*a* have wiring circuits 551 thereon. A package 500 is mounted in the recess 550*a* so that one or more bump electrodes 503 projecting from the package 500 are electrically connected to the wiring circuits 551. Embodiment 7 utilizes a mounting plate which has a recess on only one surface thereof. The recess 550*a* prevents the misalignment of the bump electrodes 503, which facilitates testing or mounting. Further, the module can be made very thin because the semiconductor device is inserted in the recess.

Embodiment 8

Figure 17:
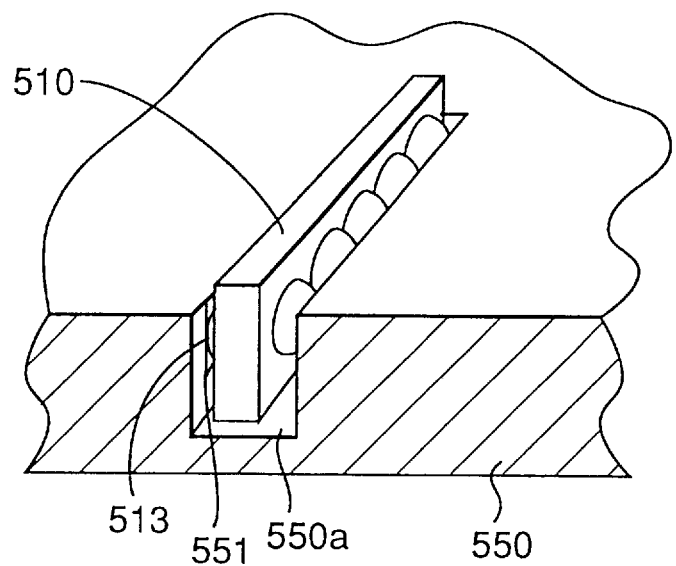
FIG. 17 shows a partial cross sectional view of the module of Embodiment 8 of the present invention.

FIG. 17 shows a perspective partial cross sectional view of the module of Embodiment 8 of the present invention. With reference to FIG. 17, the mounting plate 550 includes a channel portion 550*a* on the surface thereof. The channel 550*a* has electrical wiring 551 on the side surfaces thereof which are facing each other. A packaged semiconductor device 510 is inserted in the channel 550*a* so that one or more bump electrodes 513 projecting from the package 510 are connected to the wiring 551. The narrow width of the channel portion 550*a* of Embodiment 8 prevents the displacement of the bump electrodes 513. The other advantages of Embodiment 8 are the same as those of Embodiment 7.

Embodiment 9

Figure 18:
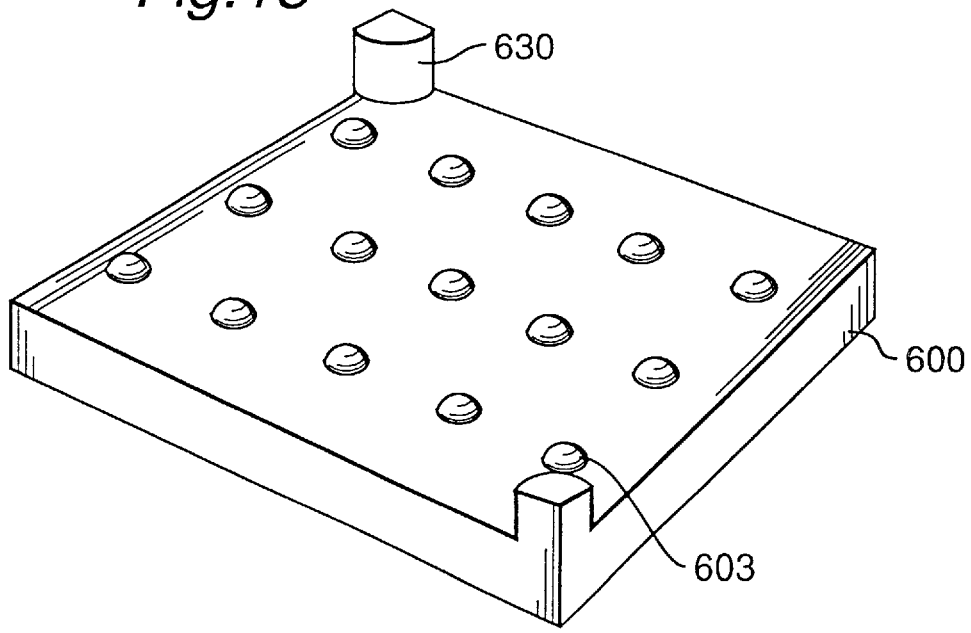
FIG. 18 is a perspective view of the semiconductor device of Embodiment 9 of the present invention.

FIG. 18 is a perspective partial cross sectional view of the semiconductor device of Embodiment 9 of the present invention. With reference to FIG. 18, the semiconductor device of this embodiment has one or more bump electrodes 603 on one of the surfaces thereof and is molded with a resin to form a package 600 so that part of each bump electrode is exposed. Further, the package includes protrusions 630 at the corners of the package, which face each other as shown in FIG. 18. These protrusions are used for alignment in mounting the semiconductor device. Typically bump electrodes have a hemispherical shape and make an unstable point contact with wiring. Also, the bump electrodes have different heights and hence their tops are not coplanar. The present embodiment prevents the displacement and contact failure of a semiconductor device. When mounting a semiconductor device on a mounting plate, one cannot see how the semiconductor device is in contact with the mounting plate. Therefore, the alignment method of the present embodiment should be very useful. The shape and the number of the protrusions used in this embodiment can vary as far as they prevent the displacement of the semiconductor device.

Embodiment 10

Figure 19:
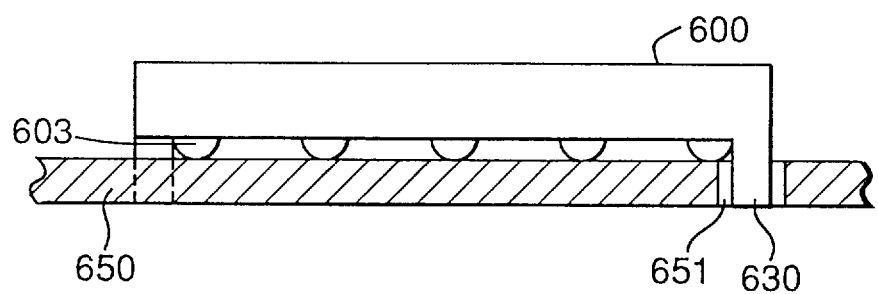
FIG. 19 shows a partial cross sectional view of the module of Embodiment 10 of the present invention.
Figure 20:
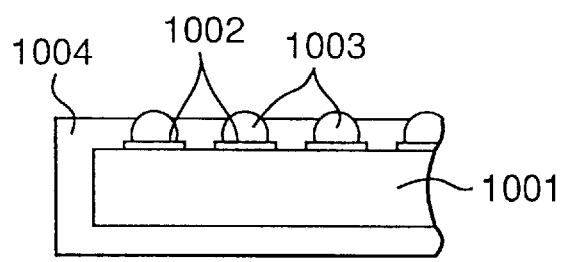
FIG. 20 shows a partial cross sectional view of a conventional semiconductor device with bump electrodes.

FIG. 19 shows a partial cross sectional view of the module of Embodiment 10 of the present invention. With reference to FIG. 19, a mounting plate 650 includes holes 651 on one of the surfaces thereof. The holes 651 receive the protrusions 630 for alignment. Embodiment 10 prevents the displacement of one or more bump electrodes 603 of the semiconductor device 600 with respect to the mounting plate 650 and accordingly facilitates tests and mounting.

The semiconductor device of the present invention has a package with a top surface and a bottom surface having bump electrodes projecting from the top and bottom surfaces, which enables the semiconductor device to be compact and thin.

There are more than one bump electrodes projecting from the top surface of the semiconductor device. The bump electrodes projecting from the bottom surface are arranged to form a mirror symmetry with the bump electrodes on the top surface. This arrangement allows the semiconductor device to be compact, thin, and stiff and to have an improved packaging density.

A module of the present invention comprises: (a) a package with a top surface and a bottom surface; (b) a first semiconductor device including a plurality of first bump electrodes on one surface thereof and a plurality of second bump electrodes on the other surface arranged to form a mirror symmetry with the first bump electrodes, the first bump electrodes projecting from the top surface of the package; (c) a second semiconductor device including a plurality of first bump electrodes on one surface thereof and a plurality of second bump electrodes on the other surface arranged to form a mirror symmetry with the first bump electrodes, the second bump electrodes projecting from the bottom surface of the package; (d) a first mounting plate connected to the first bump electrodes of the first semiconductor device; (e) a second mounting plate, including through holes between the two major surfaces thereof, with the second bump electrodes of the first semiconductor device connected to one of the major surfaces of the second mounting plate and with the first bump electrodes of the second semiconductor device connected to the other surface of the second mounting plate, the through holes connecting pairs of the second bump electrodes of the first semiconductor device with the first bump electrodes of the second semiconductor device which are designed to receive the same signals; and (f) a third mounting plate connected to the second bump electrodes of the second semiconductor device. Accordingly, this module has a high packaging density and has less sensitivity to noise.

A semiconductor device of the present invention may comprise: (a) a package with a first major surface and a second major surface; (b) bump electrodes projecting from the first and second major surfaces; (c) a first semiconductor device with two major surfaces, placed inside the package, including internal circuits in one of the major surfaces, the internal circuits connected to the bump electrodes projecting from the first major surface of the package; and (d) a second semiconductor device with two major surfaces, placed inside the package, including internal circuits in one of the major surfaces, the internal circuits being connected to the bump electrodes projecting from the second major surface of the package, the other major surface of the second semiconductor device being bonded to the other major surface of the first semiconductor device. Thus, when a module is made of this semiconductor device, either the first major surface or the second major surface of the package can be mounted on a mounting plate.

Another module of the present invention may comprise: (a) a semiconductor device with a top surface and a bottom surface including bump electrodes projecting from the top and bottom surfaces; (b) a first mounting plate connected to the bump electrodes projecting from the top surface; and (c) a second mounting plate connected to the bump electrodes projecting from the bottom surface. This module is therefore thin and stiff.

The above module of the present invention may further include an IC card wherein the first mounting plate forms a panel of the IC card. This IC card uses the space efficiently and thus can be made very thin and also has an improved packaging density.

The package of the above semiconductor device of the present invention may also include side surfaces in contact with the first and second major surfaces. Further, the semiconductor device may comprise: bump electrodes projecting from the side surfaces; and a third semiconductor device, placed inside the package, including internal circuits in one of the major surfaces thereof, the internal circuits being connected to the bump electrodes projecting from the side surfaces of the package. Thus, one can mount this semiconductor device using any of its surfaces.

Another module of the present invention may comprise: a mounting plate including a recess on one of major surfaces thereof and having a first side surface and a second side surface opposing each other; and a semiconductor device including first electrodes being connected to the first side surface and second electrodes being connected to the second side surface. This module will have an improved thickness.

Another semiconductor device of the present invention may comprise: a package with a major surface having protrusions for being inserted into recesses formed on a mounting plate; and bump electrodes projecting from the major surface of the package. This arrangement will prevent the displacement of the semiconductor device.

Another module of the present invention may comprise: (a) a mounting plate with a major surface having recesses thereon; and (b) a semiconductor device comprising: a package with a major surface including protrusions thereon, the package being mounted on the mounting plate by inserting the protrusions into the recesses of the mounting plate; and bump electrodes projecting from the major surface of the package and connected to the major surface of the mounting plate. This structure allows the module to be used in testing and mounted more easily.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device comprising:
    (a) a package with a first principal plane and a second principal plane;
    (b) bump electrodes projecting from said first and second principal planes of said package;
    (c) a first semiconductor device with two principal planes, placed inside said package, including internal circuits formed on one of said principal planes of said first semiconductor device, said internal circuits being connected to the bump electrodes projecting from said first principal plane of said package; and
    (d) a second semiconductor device with two principal planes, placed inside said package, including internal circuits formed on one of said principal planes of said second semiconductor device, said internal circuits being connected to the bump electrodes projecting from said second principal plane of said package, and the other principal plane of said second semiconductor device being bonded to the other principal plane of said first semiconductor device;
    said first and second semiconductor devices being respectively connected to the bump electrodes projecting from said first and second principal planes so that the bump electrodes on said second principal plane are arranged and connected to said internal circuits of said second semiconductor device in mirror symmetry with the arrangement and connection of the bump electrodes on said first principal plane to said internal circuits of said first semiconductor device.

2. The semiconductor device according to claim 1, wherein signals to be input into or output from said internal circuits of said second semiconductor device through said bump electrodes on said second principal plane are in mirror symmetry with those of said first semiconductor device.

3. The semiconductor device according to claim 1, further comprising bump electrodes projected from side planes of said package and at least one semiconductor device, placed inside said package, having internal circuits electrically connected to said bump electrodes on said side planes of said package.

4. The module according to claim 3 wherein each of said first and second semiconductor devices comprise first and second semiconductor substrates stacked with each other and said first and second semiconductor substrates provide with internal circuits electrically connected to said plurality of first bump electrodes and plurality of second bump electrodes, respectively.

5. A module comprising:
    (a) a first semiconductor device packaged within a package having top and bottom planes, said package having a plurality of first bump electrodes arranged on said top plane which are electrically connected to internal circuits of said first semiconductor device and a plurality of second bump electrodes arranged on said bottom plane in mirror symmetry with said plurality of first bump electrodes;
    (b) a second semiconductor device within a package having top and bottom planes, said package having a plurality of first bump electrodes arranged on said top plane which are electrically connected to internal circuits of said second semiconductor device and a plurality of second bump electrodes arranged on said bottom plane in mirror symmetry with said plurality of first bump electrodes;
    (c) a first mounting plate electrically connected to said plurality of first bump electrodes of said first semiconductor device;
    (d) a second mounting plate arranged between said first and second semiconductor devices and electrically connected to said plurality of second bump electrodes of said first semiconductor device on top side thereof and said plurality of first bump electrodes on bottom side thereof, said second mounting plate having a through-hole through which one of said second bump electrodes of said first semiconductor device and corresponding one of said first bump electrodes of said second semiconductor device are electrically connected; and
    (e) a third mounting plate electrically connected to said plurality of second bump electrodes of said second semiconductor device.

6. A module of a plurality of semiconductor devices comprising:
    a plurality of semiconductor devices, each being packaged within a package having top and bottom planes, said package having a plurality of first bump electrodes arranged on said top plane which are electrically connected to internal circuits of each semiconductor device and a plurality of second bump electrodes arranged on said bottom plane; and said package having a pair of first and second mounting plates between which said plurality of semiconductor devices are arranged in parallel to each other, said first mounting plate being electrically connected to said plurality of first bump electrodes of each semiconductor device and said second mounting plate being electrically connected to said plurality of second bump electrodes of each semiconductor device.

7. The module according to claim 6, wherein the module is designed as an IC card.

8. A module comprising:

a semiconductor substrate having internal circuits formed on one principal plane of said substrate;

a package within which said semiconductor substrate is packaged, said package having a plurality of bump electrodes arranged on one principal plane of said package which are electrically connected to said internal circuits of said semiconductor substrate; and a mounting plate electrically connected to said plurality of bump electrodes of said package, wherein said mounting plate has recesses formed on said mounting plate and said package has protrusions to be fitted into said recesses, respectively, upon mounting said package onto said mounting plate.

9. A semiconductor device assembly comprising:

a first semiconductor device including internal circuitry and having first and second principal planes;

a second semiconductor device including internal circuitry and having first and second principal planes;

a package receiving said first and semiconductor devices being arranged back to back, said package also having first and second principal planes;

bump electrodes connected to the internal circuitry of said first and second semiconductor devices, the bump electrodes connected to the internal circuitry of said first semiconductor device being arranged on the first side of said package, the bump electrodes connected to the internal circuitry of said second semiconductor device being arranged on the second side of said package;

said bump electrodes on said second side of said package being physically arranged and electrically connected to said internal circuitry of said second semiconductor device in mirror symmetry to the physical arrangement and electrical connection of the bump electrodes of the first side of said package and their connection to said internal circuitry of the first semiconductor device.

10. The semiconductor device assembly of claim 9 wherein said semiconductor device is formed with a conductive layer being applied to said semiconductor device which selects the bump electrode for connection to a selected part of said internal circuitry, to thereby determine whether the semiconductor device is said first semiconductor device or said second semiconductor device which is mirror symmetric to said first semiconductor device.

* * * * *